(12) United States Patent
Lam et al.

(10) Patent No.: US 12,057,864 B2
(45) Date of Patent: Aug. 6, 2024

(54) HARDWARE IMPLEMENTATION OF FREQUENCY TABLE GENERATION FOR ASYMMETRIC-NUMERAL-SYSTEM-BASED DATA COMPRESSION

(71) Applicant: Hong Kong Applied Science and Technology Research Institute Company Limited, Hong Kong (HK)

(72) Inventors: Hing-Mo Lam, Hong Kong (HK); Hailiang Li, Hong Kong (HK); Ho Yu Wong, Hong Kong (HK); Yan Huo, Hong Kong (HK); Tao Li, Hong Kong (HK); Ka Lung Tim Wong, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 203 days.

(21) Appl. No.: 17/948,421

(22) Filed: Sep. 20, 2022

(65) Prior Publication Data

US 2024/0097703 A1 Mar. 21, 2024

(51) Int. Cl.
*H03M 13/00* (2006.01)
*H03M 7/30* (2006.01)
*H03M 7/40* (2006.01)

(52) U.S. Cl.
CPC ........ *H03M 7/6041* (2013.01); *H03M 7/4093* (2013.01)

(58) Field of Classification Search
CPC .................... H03M 7/6041; H03M 7/4093
USPC ................... 341/50, 106, 94, 51, 52
See application file for complete search history.

(56) References Cited

U.S. PATENT DOCUMENTS

2016/0336959 A1* 11/2016 Henry ................ H03M 7/42

FOREIGN PATENT DOCUMENTS

CN 110602498 A 12/2019
CN 113572479 A 10/2021

OTHER PUBLICATIONS

Huang Hai et al., "Design and Implementation of VLSI for Finite State Entropy Encoding", Journal of Computer-Aided Design & Computer Graphics, vol. 33, No. 4, Apr. 2021.

\* cited by examiner

*Primary Examiner* — Peguy Jean Pierre
(74) *Attorney, Agent, or Firm* — Stuart T. Auvinen; gPatent LLC

(57) ABSTRACT

A lossless data compressor prevents normalization overruns on-the-fly as symbol occurrence counts are rounded to generate symbol frequencies, allowing an encoding table generator to generate encoding table entries without waiting for the symbol frequency table to finish filling. Rounding errors are accumulated as symbols are normalized and compensated for by reducing a symbol frequency when the symbol frequency is at least 2 and the accumulated errors have exceeded a threshold. The symbol frequency is also reduced when the number of remaining states in the encoding table is insufficient for a number of remaining unprocessed symbols and states for a current encoding table entry. Since error compensation occurs as symbols are being normalized, encoding table generation is not forced to wait for all symbols in the block to be processed, reducing latency. Three pipeline stages can operate on three input blocks: symbol counting, normalization/error compensation/encoding table generation, and data encoding.

20 Claims, 15 Drawing Sheets

L=BLK_SIZE/TSTATE
IF OCCUR[i] = 0, THEN FREQ[i] = 0
ELSE IF OCCUR[i] < L, THEN FREQ[i] = 1
ELSE FREQ[i] = ROUND(OCCUR[i]/L)

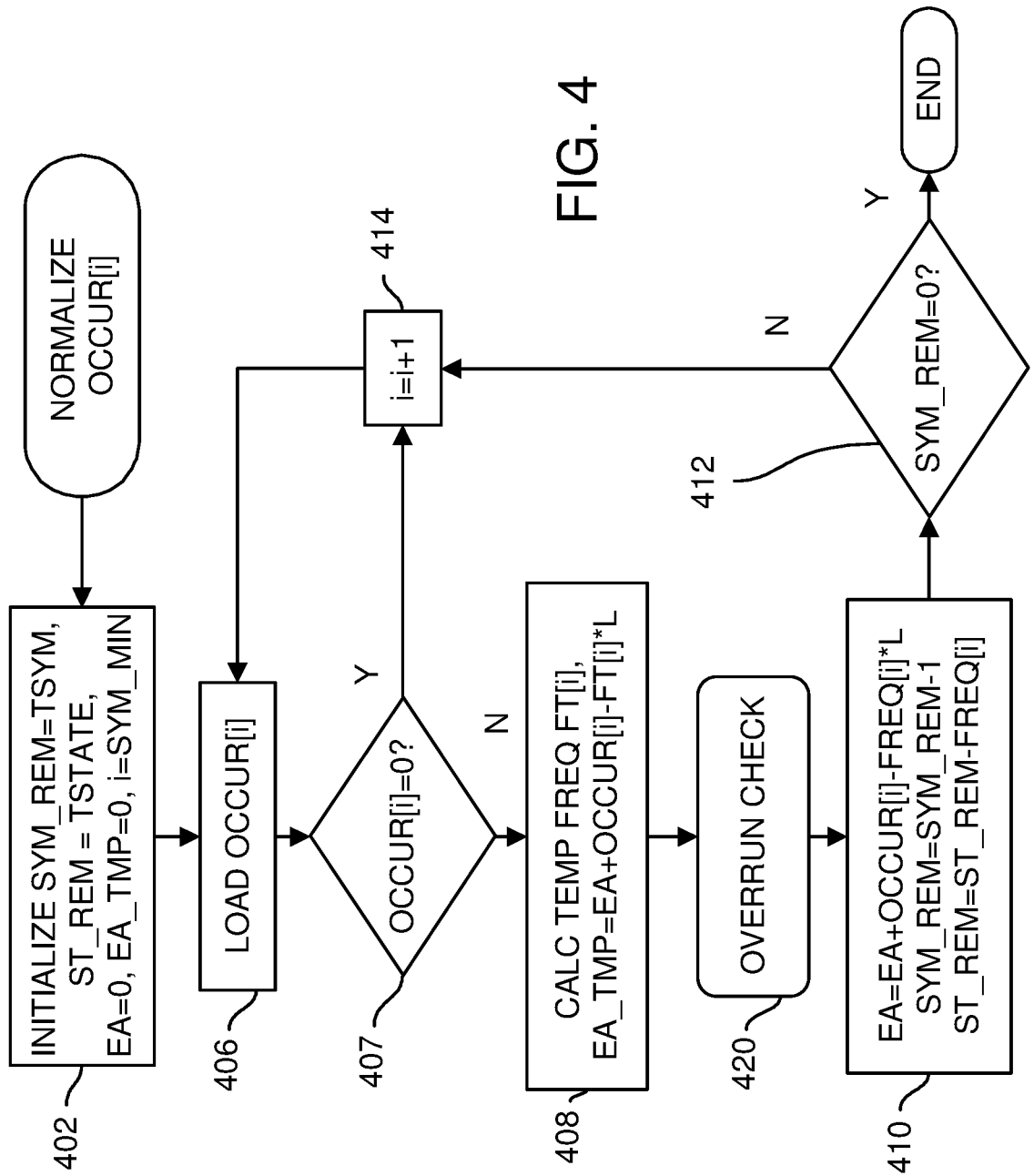

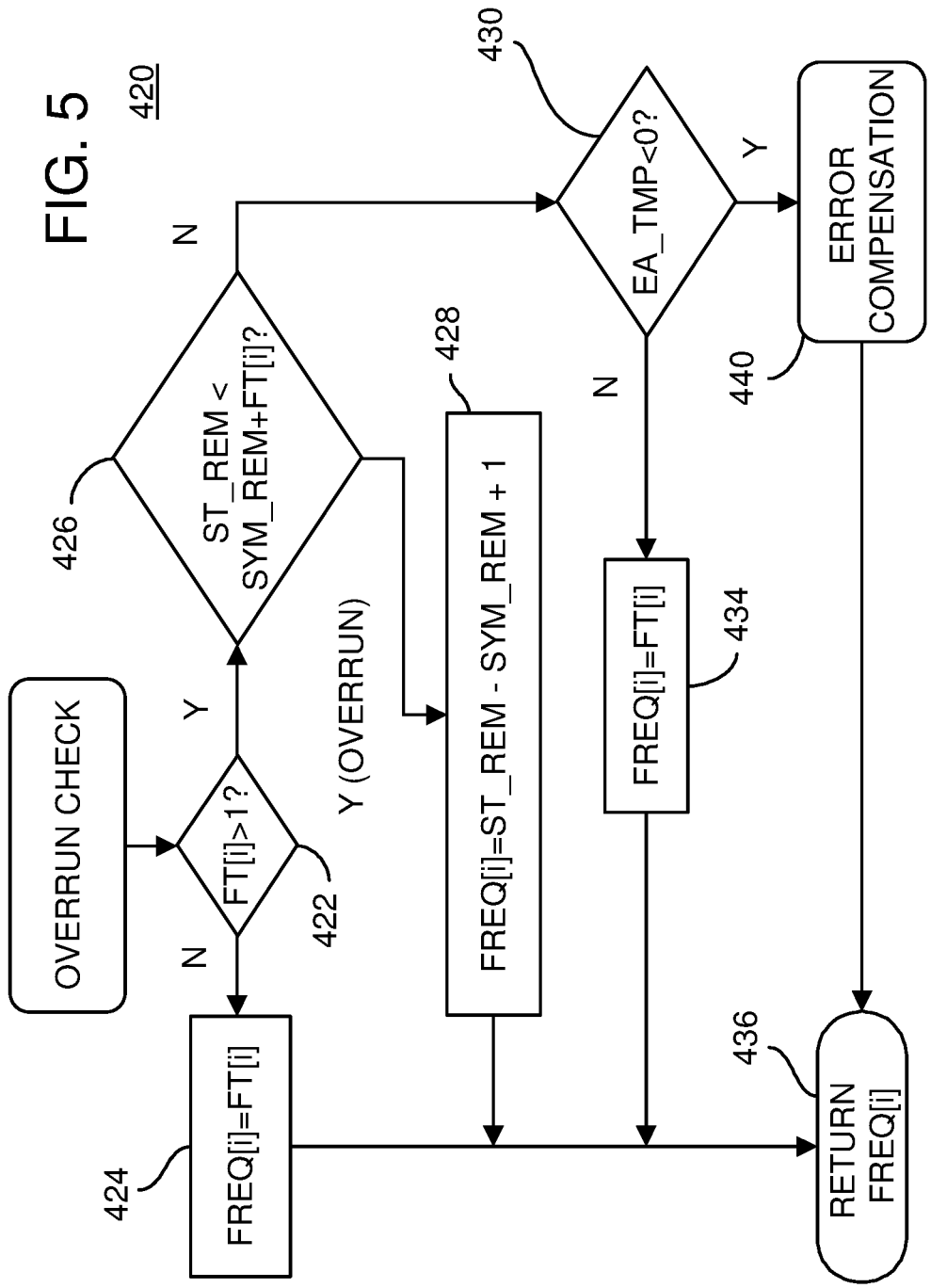

HARDWARE IMPLEMENTATION OF FREQUENCY TABLE GENERATION FOR ASYMMETRIC-NUMERAL-SYSTEM-BASED DATA COMPRESSION

FIELD OF THE INVENTION

This invention relates to data compression, and more particularly to normalization of frequency tables using parallel hardware.

BACKGROUND OF THE INVENTION

Data compression engines may use lossy or lossless methods. Image data such as videos often use lossy compression since loss of visual data may not be especially noticeable. Other data is not loss tolerant, so lossless data compression is used.

Neural Networks use weights for nodes within the network. The network topology and connectivity can be defined by a feature map. These weights and feature maps can be quite large for deep neural networks and convolutional neural networks. Neural network weights and feature maps may be compressed before storage or transmission. Since the computation results may be altered by data compression losses, lossless data compression is desirable for neural networks.

FIG. 1 shows a neural network that has its weights and feature maps compressed before storage or transmission. Neural network 104 can be a Graphics Processing Unit (GPU), a specialized neural network processor, or some other processor. Neural network 104 may have been trained and its weights and feature maps adjusted to be optimized for a particular problem or data set. These weights and feature maps may be backed up or stored in memory 102.

However, memory 102 may be remote from neural network 104, such as when neural network 104 is on a portable device and memory 102 is cloud storage. The connection between neural network 104 and memory 102 may be limited in bandwidth. Compressor 100 can compress the weights and feature maps from neural network 104 using lossless compression, and the compressed data can be sent to memory 102. The amount of memory required in memory 102 for storage can be reduced, as well as the bandwidth consumed for transmission.

Compressed weights and feature maps stored in memory 102 may be transmitted over network links to a local device that includes compressor 100, which decompresses the weights and feature maps and loads them into neural network 104 to configure neural network 104 for a specific processing task.

Some data blocks may be so random or unstructured that it poorly compresses. It is better not to attempt compression of such data blocks since the compressed data may be larger than the original data. Other data blocks may be easily compressible, such as blocks containing all zeros.

Classic lossless compression algorithms include winzip, winrar, and 7z. These compressors often have both run-length coding and entropy coding. Run-length coding suffers from a large search window which can create a large bottleneck. Entropy coding such as Huffman coding, arithmetic coding, Asymmetric Numerical System (ANS), tabled Asymmetric Numerical System (tANS), and Finite State Entropy (FSE) coding may require a symbol frequency table. This symbol frequency table may be created or populated during compression and transmitted along with the compressed data. This overloaded symbol frequency table is an overhead that consumes bandwidth and, in some cases, reduces compression efficiency.

Parallel implementations can be difficult with such classical two-stage encoding systems using both run-length and entropy coding. Latency can be long. Frequency tables may be sorted so that symbols are ranked with high-occurrence symbols occurring before low-occurrence symbols. However, frequency table sorting is time consuming and encoding must wait until the frequency table sorting is completed, reducing pipeline efficiency.

Rather that sort the frequency table, the frequency table may be normalized. The aggregate number of occurrences for all symbols is reduced to a target number of states. For example, a 4K block with N=4K symbols per block can be normalized to 256 states S by dividing the symbol occurrence by N/S and rounding. A symbol with 32 occurrences is normalized to 2, while symbols with 23 occurrences or with 8 occurrences are normalized to 1.

FIG. 2 shows a prior-art data compressor that generates a frequency table. Input data is stored in input buffer 12 and is also applied to symbol counter 140 which counts the number of occurrences of each symbol in the block. These occurrences are stored in occurrence memory 10. The occurrence values are normalized by normalizer 150 to generate symbol frequencies that are stored in frequency table 20. The normalized symbol frequencies from frequency table 20 are used by encoding table generator 154 to generate symbol encodings that are stored in encoding table 30. These encodings stored in encoding table 30 are used by encoder 156 to replace input symbols in input buffer 12 with coded symbols that are stored in output buffer 40 for output as the compressed encoded data for the block.

Faster throughput could be achieved by pipelining symbol counter 140, normalizer 150, encoding table generator 154, and encoder 156. However, normalizer 150 and encoding table generator 154 may not be able to operate in parallel. Normalizer 150 reads occurrence memory 10 through symbol counter 140 to generate frequency table 20. Often this only requires reading frequency table 20 only once.

An overrun condition can occur during normalization. Overrun occurs when normalization generates too many states in aggregate. For example, when a 4K-byte block is normalized to 256 states, but the aggregate sum of the frequencies is greater than 256, an overrun has occurred. The aggregate sum of the states must be reduced to 256 to correct this overrun.

FIGS. 3A-3C highlight normalization of symbol occurrences to generate a frequency table. In FIG. 3A, a histogram of symbol occurrences is shown, such as stored in occurrence memory 10. When symbols are bytes there are 256 possible symbols. In this example there are 30 occurrences of symbol 0, 60 occurrences of symbol 1, one occurrence each of symbols 2, 3, 4, and 40 occurrences of symbol 255. For a 4K byte block, the sum of the occurrences OCCUR[i] will be 4096.

FIG. 3B shows pseudo code for normalization. The ratio L is the block size divided by the number of normalized states, or 4K/256=16 in this example. When the occurrence OCCUR[i] for symbol i is 0, then the frequency FREQ[i] is set to zero for this symbol i.

When the occurrence is less than ratio L, but more than 0, then the frequency FREQ[i] is set to 1 for this symbol. Otherwise the frequency FREQ[i] is set to round(OCCUR[i]/L) for this symbol i, where round is a rounding operator. For example 3.4 can be rounded down to 3 but 3.5 is rounded up to 4.

This pseudo code preserves non-zero values that would otherwise be rounded down to zero. Occurrence values of 1 to 7 are rounded up to 1 rather than rounded down to 0. This is beneficial since it distinguishes between true 0 occurrences and small non-zero occurrences of symbols. However this preserving of small non-zero values can introduce overrun errors.

FIG. 3C shows a histogram of symbol frequencies, such as stored in frequency table 20. Symbol 0 has an occurrence of 30 that is normalized to 2 for FREQ[0]. Symbol 1 has an occurrence of 60 that is normalized to 4 for FREQ[1]. Symbol 255 has an occurrence of 40 that is normalized to 3 for FREQ[255].

Symbols 2, 3, 4 each has an occurrence of 1 that is normalized to 1 for FREQ[2], FREQ[3], and FREQ[4]. The sum of occurrences of symbols 0-4 is 93, which is 93/4096=0.022 or 2.2% of the input block, but the sum of frequencies for symbols 0-4 is 9, or 9/256=0.35 or 3.5% of the normalized block. Symbols 2-4 have consumed a greater proportion of the available states of the normalized block than their share of the input block. This can lead to overrun, especially when more symbols have small non-zero values.

Correcting the overrun condition typically requires multiple reads of frequency table 20 so that the frequencies may be reduced to correct the overrun. One technique is generate normalized frequencies for the entire input block, then sum the frequencies. An overrun is signaled when the sum of the frequencies is greater than the number of states.

When the overrun is signaled, then frequency table 20 is scanned for the symbol with the maximum frequency value. If the overrun is less than one-quarter of this maximum value, then this maximum value is reduced by the overrun value. The overrun is thus compensated.

However, if the overrun is more than one-quarter of this maximum value, then more complex processing is required to compensate the overrun. Frequency table 20 is scanned for large frequencies that are 9 or more. Each of these large frequencies is reduced by FLOOR([FREQ[i]−1]/8), where FLOOR is the round-down operator. The sum of all frequencies after this correction is obtained to determine if the overrun has been corrected.

When the overrun has still not been corrected, then smaller frequencies are selected in the next pass through frequency table 20. Frequency table 20 is scanned for large frequencies that are 5 or more. Each of these large frequencies is reduced by FLOOR([FREQ[i]−1]/4). The sum of all frequencies after this correction is obtained to determine if the overrun has been corrected.

When the overrun has still not been corrected, even smaller frequencies are selected in the fourth pass through frequency table 20. Frequency table 20 is scanned for any frequencies that are 3 or more. Each of these selected frequencies is reduced by FLOOR([FREQ[i]−1]/2). The sum of all frequencies after this correction pass is obtained to determine if the overrun has been corrected.

When the large overrun has still not been corrected after the fourth pass, then each FREQ[i] of 2 or more is reduced by 1 in the fifth pass. This can be repeated if needed until the overrun is eliminated and the sum of the states is 256 or less.

Each reading of or pass through frequency table 20 can require a number of read clock cycles equal to the number of symbols, or 256 in this example. A worst-case block that has many near-zero input symbol values may require 6 passes or 6×256 clocks. Encoding table generator 154 also requires reading all frequencies in frequency table 20, another 256 clocks, but encoding table generator 154 may have to wait for up to 6×256 clocks for the overrun to be compensated and normalization to finish.

Thus normalization of input blocks with many near-zero symbols can result in overrun errors. These overrun errors can require many passes through the frequency table to adjust these frequencies to compensate for the overrun before encoding table generation.

What is desired is a lossless compression system that does not sort a symbol frequency table. A data compressor that corrects normalization overrun errors on the fly is desirable. It is desired to normalize frequency occurrences and correct potential overruns as the frequency table is being created or populated, without waiting for the frequency table to be completed before compensating overrun errors. It is further desired to perform normalization, overrun compensation, and encoding table generation in parallel. It is desired to reduce latency of normalization overrun correction to reduce overall latency of a data compression engine.

BRIEF DESCRIPTION OF THE DRAWINGS

FIG. 4 is a flowchart of normalization of symbol occurrences to generate a frequency table.

FIG. 5 is a flowchart of the overrun checking sub-process.

DETAILED DESCRIPTION

The present invention relates to an improvement in data compression. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIG. 4 is a flowchart of normalization of symbol occurrences to generate a frequency table. A symbol counter counts the number of occurrences of each symbol i as OCCUR[i] that can be stored in an occurrence memory.

When normalization of a new block begins, then various parameters are initialized for the new block, step 402. The number of unprocessed symbols remaining in the block, SYM_REM, is set to the total number of non-zero-occurrence symbols to process, TSYM. The remaining unprocessed states, ST_REM, is set to the maximum possible number of states, TSTATE, in the frequency table, such as 256. Error accumulated EA is initially cleared and a temporary EA EA_TMP is also cleared. The symbol index selector i is initially set to point to the smallest symbol with a non-zero occurrence.

Occurrence memory 10 is read, step 406, to load the occurrence value for symbol i. When the symbol has zero occurrences, or OCCUR[i]=0, step 407, then further processing for this zero-occurrence symbol is skipped, and the next symbol is fetched, steps 414, 406. Otherwise, in step 408, a test or temporary value of the frequency, FT[i], is calculated such as by using the following pseudo-code:

if OCCUR[i]=0, then FT[i]=0;
else FREQ_RND[i]=round(OCCUR[i]/L).
if FREQ_RND[i]=0 then FT[i]=1;
else FT[i]=FREQ_RND[i].
where FREQ_RND[i] is a rounded frequency and normalization ratio L is the input block size BLK_SIZ, divided by the total states TSTATE, or 4096/256=16 in this example. This pseudo-code sets FT[i] to 0 for OCCUR[i]=0, sets FT[i] to 1 for OCCUR[i]>0 and <L, and to round(OCCUR[i]/L) for OCCUR[i] of L or more. This preserves near-zero occurrences that otherwise would be rounded away to 0 during normalization.

Also in step 408 the temporary accumulated error EA_TMP is calculated as:

$$EA\_TMP = EA + OCCUR[i] - FT[i]*L$$

which is accumulating the remainder or error from rounding.

Figure 6:
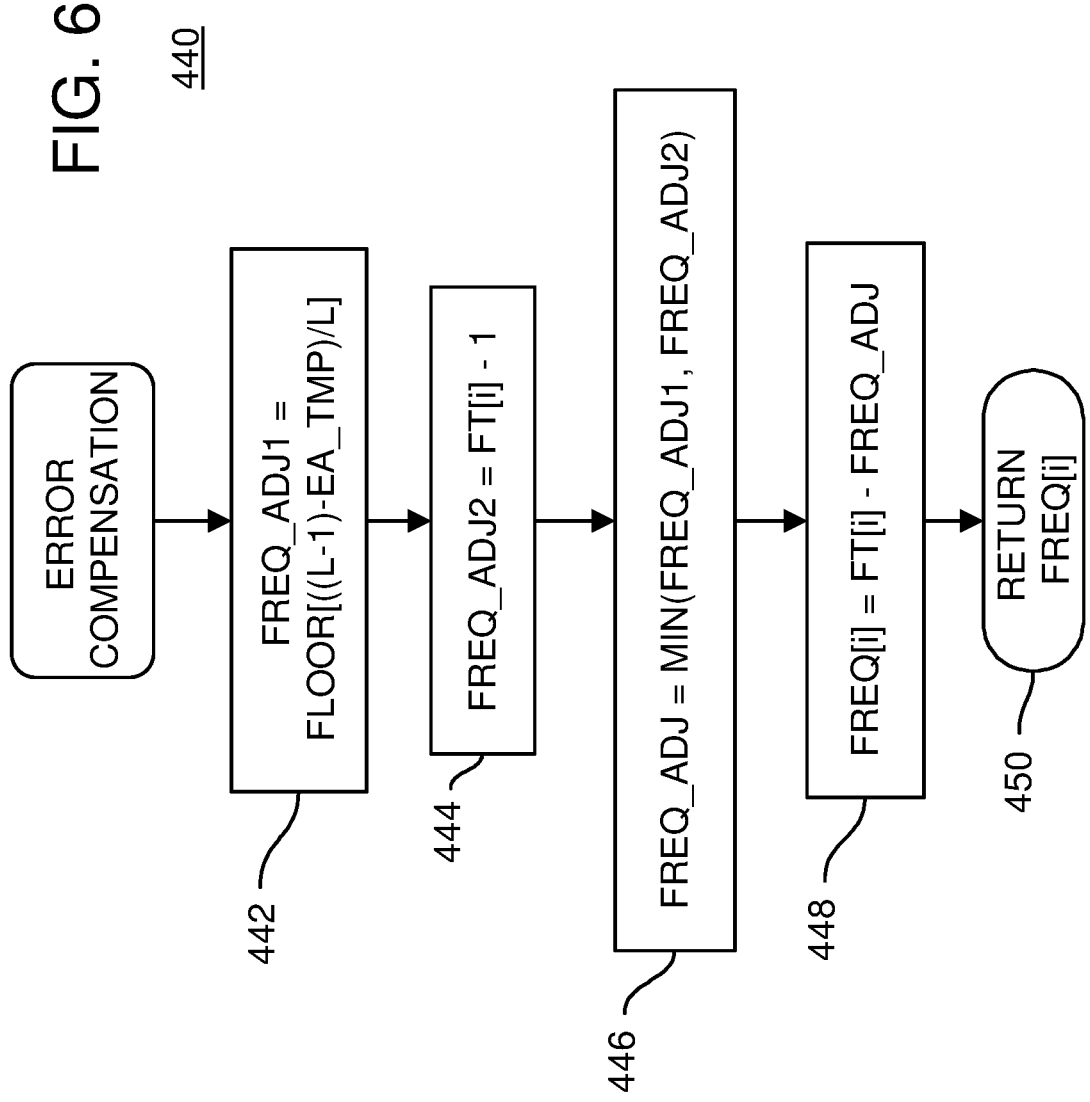
FIG. 6 is a flowchart of the error compensation sub-process.

Overrun checking 420 is then performed, as shown in FIG. 5. When overrun errors are found, they may be compensated for using error compensation 440 as shown in FIG. 6. Overrun checking 420 sets FREQ[i] to FT[i] after adjusting for any overrun errors.

Rather than wait for all symbols to be normalized and frequency table 20 completely filled, overrun errors are checked for and compensated on-the-fly as symbol index selector i advances through the input symbols.

After any overrun errors are compensated by overrun checking 420, accumulated error EA is set to EA+OCCUR[i]−FREQ[i]*L, step 410. The remaining symbols to process SYM_REM is decremented and the remaining states available ST_REM is reduced by the current normalized frequency for symbol i, FREQ[i], or $$ST\_REM = ST\_REM - FREQ[i].$$

When the remaining symbols to process, SYM_REM is greater than 0, step 412, then symbol index selector i is decremented, step 414, and then next symbol's occurrence, OCCUR[i], loaded from occurrence memory 10, step 406. The process loop is repeated for this next symbol. Once the remaining symbols SYM_REM reaches 0, step 412, then normalization of this block is completed.

FIG. 5 is a flowchart of the overrun checking sub-process. Overrun checking 420 is called during normalization (FIG. 4). When temporary frequency FT[i] is 1 or less, step 422, then no error compensation can be performed since the frequency is already at its lowest possible non-zero value. The frequency is set to the temporary frequency, FREQ[i]=FT[i], step 424. FREQ[i] is returned in step 436 to the normalization routine.

When temporary frequency FT[i] more than 1, step 422, then error compensation can be performed by reducing the frequency. When the number of states remaining is less than the sum of the number of symbols remaining and the temporary frequency, or ST_REM<SYM_REM+FT[i], then an overrun has occurred, step 426. There are not enough states remaining for assigning states to the temporary frequency and to unprocessed symbols. Instead, the frequency is set to the available states, step 428, or FREQ[i]=ST_REM−SYM_REM+1. FREQ[i] is returned in step 436 to the normalization routine.

When an overrun is not signaled, step 426, the states remaining is sufficient to assign FT[i] states for this symbol i. When the accumulated error is positive, step 430, then the frequency is set to the temporary frequency, FREQ[i]=FT[i], step 434. FREQ[i] is returned in step 436 to the normalization routine.

When an overrun is not signaled, step 426, and the accumulated error is negative, step 430, then error compensation 440 (FIG. 6) is called to compensate some of the accumulated errors. Error compensation 440 attempts to reduce the accumulated errors and returns FREQ[i], which then is returned in step 436 to the normalization routine.

FIG. 6 is a flowchart of the error compensation sub-process. Error compensation 440 is called during overrun checking (FIG. 6). An adjustment or reduction in the frequency is calculated two different ways and then the minimum adjustment is selected and subtracted from the temporary frequency.

The first frequency adjustment FREQ_ADJ1 is calculated from the normalization ratio L and the temporary accumulated error EA_TMP as:

$$FREQ\_ADJ1 = FLOOR[((L-1) - EA\_TMP)/L]$$

in step 442. Since the temporary accumulated error is negative (step 430, FIG. 5), this tests adjusting by the entire temporary accumulated error.

The second frequency adjustment FREQ_ADJ2 is calculated in step 444 as:

$$FREQ\_ADJ2 = FT[i] - 1$$

which tests reducing the frequency to 1, its lowest non-zero value.

The minimum frequency adjustment, min(FREQ_ADJ1, FREQ_ADJ2) is selected in step 448 as FREQ_ADJ and subtracted from the temporary frequency FT[i] in step 448, FREQ[i]=FT[i]−FREQ_ADJ. Then FREQ[i] is returned in step 450 to the overrun checking routine and then returned up to the normalization routine.

Error compensation 440 thus adjusts by the entire temporary accumulated error when possible. If the entire temporary accumulated error is too large, it adjusts the current frequency down to its minimum non-zero value of 1.

Figure 1:
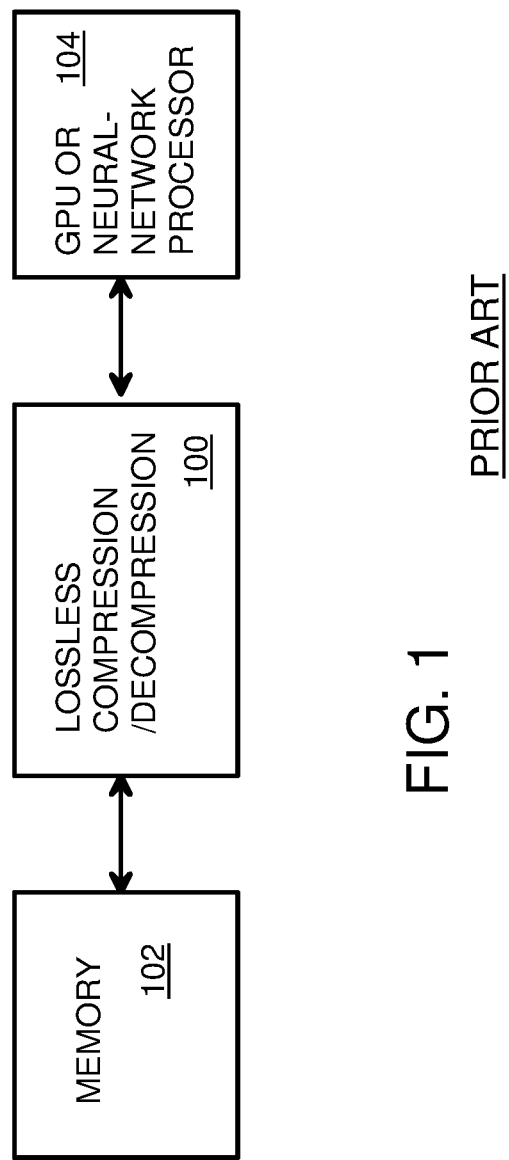
FIG. 1 shows a neural network that has its weights and feature maps compressed before storage or transmission.
Figure 2:
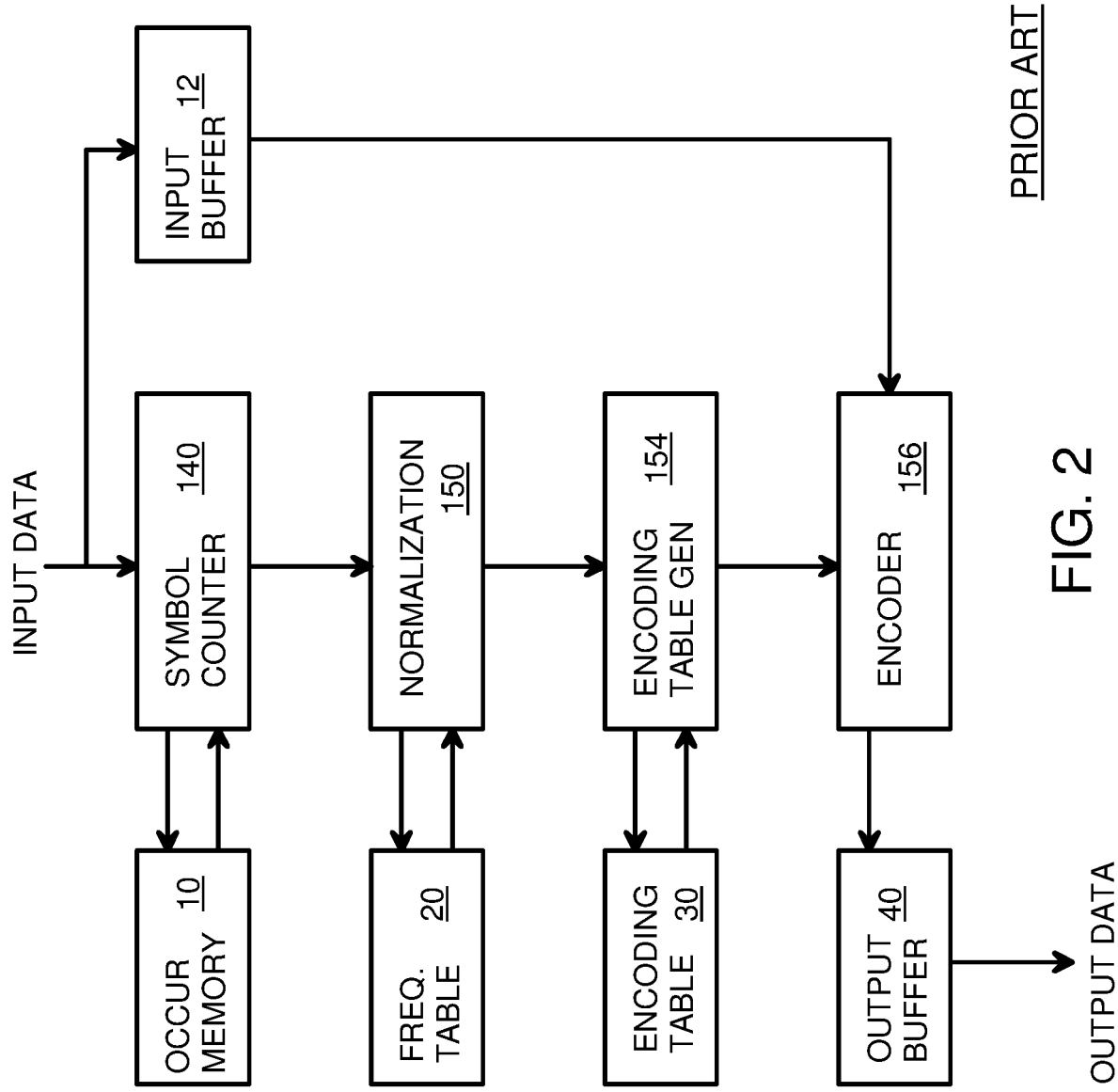
FIG. 2 shows a prior-art data compressor that generates a frequency table.
Figure 7A:
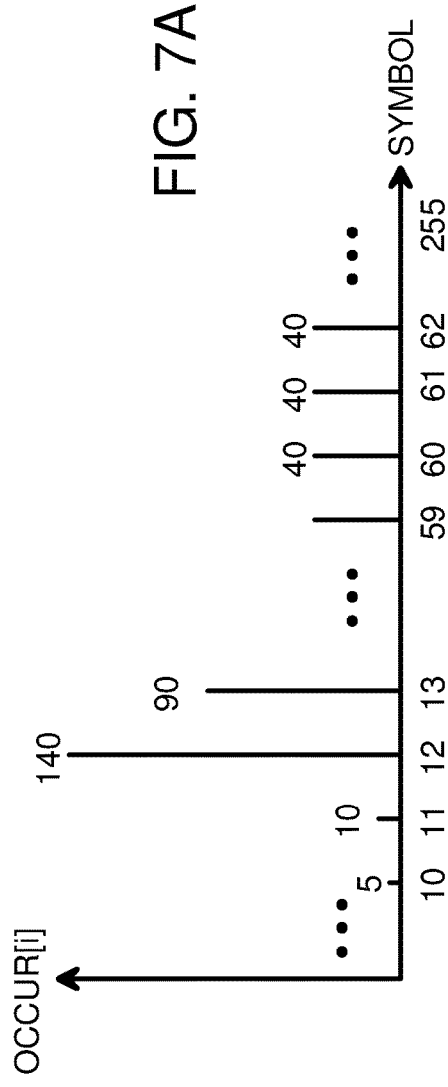
FIGS. 7A-7B show histograms of symbol occurrence and frequency with overrun error compensation.
Figure 7B:
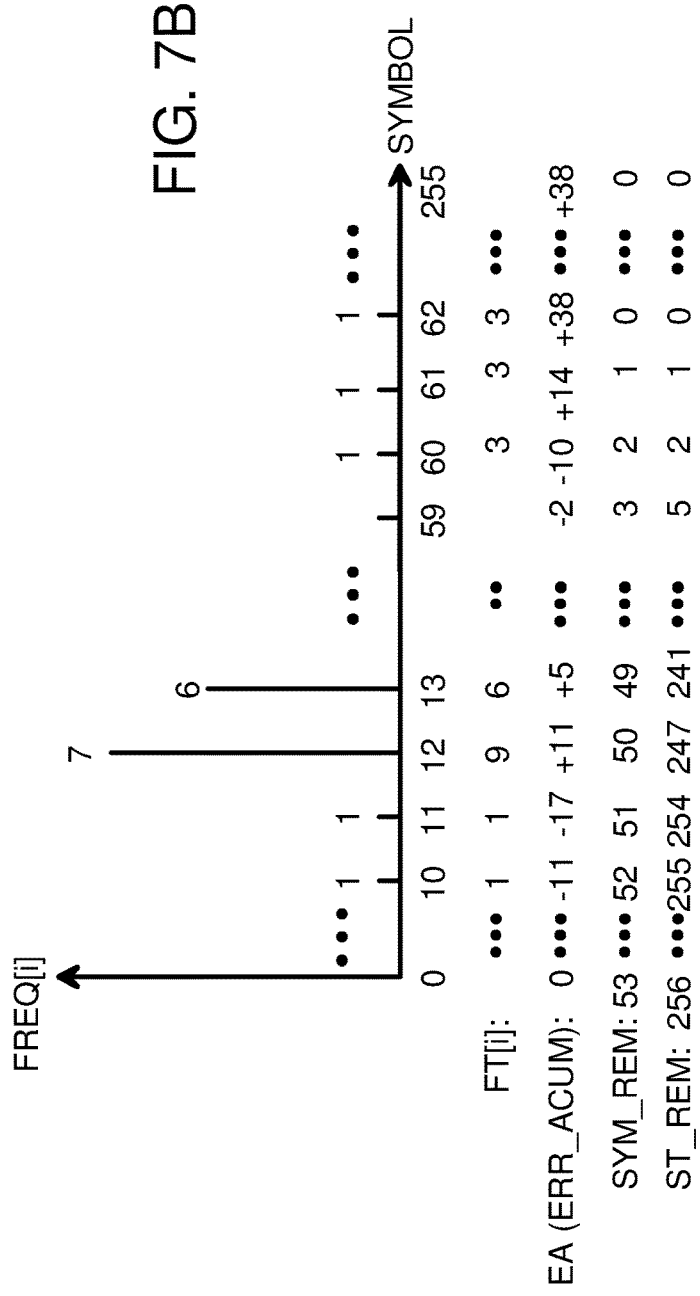

FIGS. 7A-7B show histograms of symbol occurrence and frequency with overrun error compensation. In FIG. 7A, the input symbol occurrence distribution is shown, which can be OCCUR[i] stored in occurrence memory 10 (FIG. 2). FIG. 7B shows the symbol frequency distribution, which can be stored as FREQ[i] in frequency table 20.

Normalization converts OCCUR[i] (FIG. 7A) to FREQ[i] (FIG. 7B) such as by dividing OCCUR[i] by the normalization ratio L and rounding to obtain FREQ[i]. The shape of the occurrence and frequency distribution curves are similar but not necessarily identical.

Symbols 0 to 9 have zero values of occurrence, so the first non-zero-occurrence symbol is symbol 10. OCCUR[10] is 5, and for L=16, OCCUR[i]/L is 5/16 which is assigned FREQ[10]=1 to preserve non-zero occurrences. The error is 5-16 or −11, which becomes the first accumulated error EA. The symbols remaining and states remaining are each decremented and next symbol 11 is processed.

OCCUR[11] is 10, and 10/16 rounds to 1, so FREQ[11] is 1. The current symbol's error or remainder is 10-16 or −6, so −6 is added to the prior accumulated error of −11, producing a new EA of −17. Since FREQ[10] and FREQ[11] are the lowest non-zero value of 1, these errors cannot yet be compensated for.

Symbol 12 has a much higher occurrence of 140, and 140/16 is 8.75, which rounds up to 9, so the temporary frequency FT[12] is 9. The temporary accumulated error EA_TMP is EA+OCCUR[i]−FT[i]*L or −17+140−9*16=−21.

FREQ_ADJ1 is FLOOR[((L−1)−EA_TMP)/L] or FLOOR(15−(−21))/16 or FLOOR(36/16)=2 remainder 4 so the temporary frequency FT[12]=9 is reduced by a frequency adjustment of 2 to generate the final FREQ[12]=7. The new accumulated error is −17+140−7*16=+11. Since the accumulated error is now positive, all prior errors have been compensated.

The symbols remaining are reduced by 1 but the states remaining are reduced by FREQ[12]=7, since 7 states are required for encoding FREQ[12]=7.

Symbol 13 has OCCUR[13]=90, and 90/16=5.625 which rounds to 6, so FT[13]=6. Since the accumulated error is positive, no compensation is needed, and FREQ[13]=FT[13]=6. The new accumulated error is EA+OCCUR[i]−FREQ[i]*L=+11+90−6*16=+5.

The symbols remaining are reduced by 1 but the states remaining are reduced by FREQ[13]=6, since 7 states are required for encoding FREQ[13]=6. Other non-zero-occurrence symbols are processed and the remaining symbols and remaining states are reduced for each processed symbol.

At the end of processing symbol 59 and at the beginning of processing symbol 60, the accumulated error EA=−2, SYM_REM=3, and ST_REM=5.

Symbols 60, 61, 62 each have OCCUR[i]=40, and 40/16=2.5 which rounds to 3 so FT[i]=3. However, the states remaining ST_REM is only 5 after symbol 59 finishes processing and symbol 60 begins. There are also only 3 remaining symbols. An overrun is signaled in step 426, FIG. 5, since ST_REM<SYM_REM+FT[i] is 5<3+3. The number of states remaining is less than the sum of the number of symbols remaining and the temporary frequency. There are not enough states remaining for assigning states to the temporary frequency and to unprocessed symbols. Instead, the frequency is set to the available states, step 428, or FREQ[i]=ST_REM−SYM_REM+1=5−3+1=3. The new accumulated error is EA+OCCUR[i]−FREQ[i]*L=−2+40−3*16=−10.

For symbol 61, OCCUR[61]=40, FT[61]=3, and ST_REM and SYM_REM are both 2. An overrun is signaled in step 426, FIG. 5, since ST_REM<SYM_REM+FT[i] is 2<2+3. The number of states remaining is less than the sum of the number of symbols remaining and the temporary frequency. There are not enough states remaining for assigning states to the temporary frequency and to unprocessed symbols. Instead, the frequency is set to the available states, step 428, or FREQ[i]=ST_REM−SYM_REM+1=2−2+1=1. The new accumulated error is EA+OCCUR[i]−FREQ[i]*L=−10+40−1*16=+14.

For symbol 62, OCCUR[62]=40, FT[62]=3, and ST_REM and SYM_REM are both 1. An overrun is signaled in step 426, FIG. 5, since ST_REM<SYM_REM+FT[i] is 1<1+3. The number of states remaining is less than the sum of the number of symbols remaining and the temporary frequency. There are not enough states remaining for assigning states to the temporary frequency and to unprocessed symbols. Instead, the frequency is set to the available states, step 428, or FREQ[i]=ST_REM−SYM_REM+1=1−1+1=1. The new accumulated error is EA+OCCUR[i]−FREQ[i]*L=14+40−1*16=+38.

Figure 8:
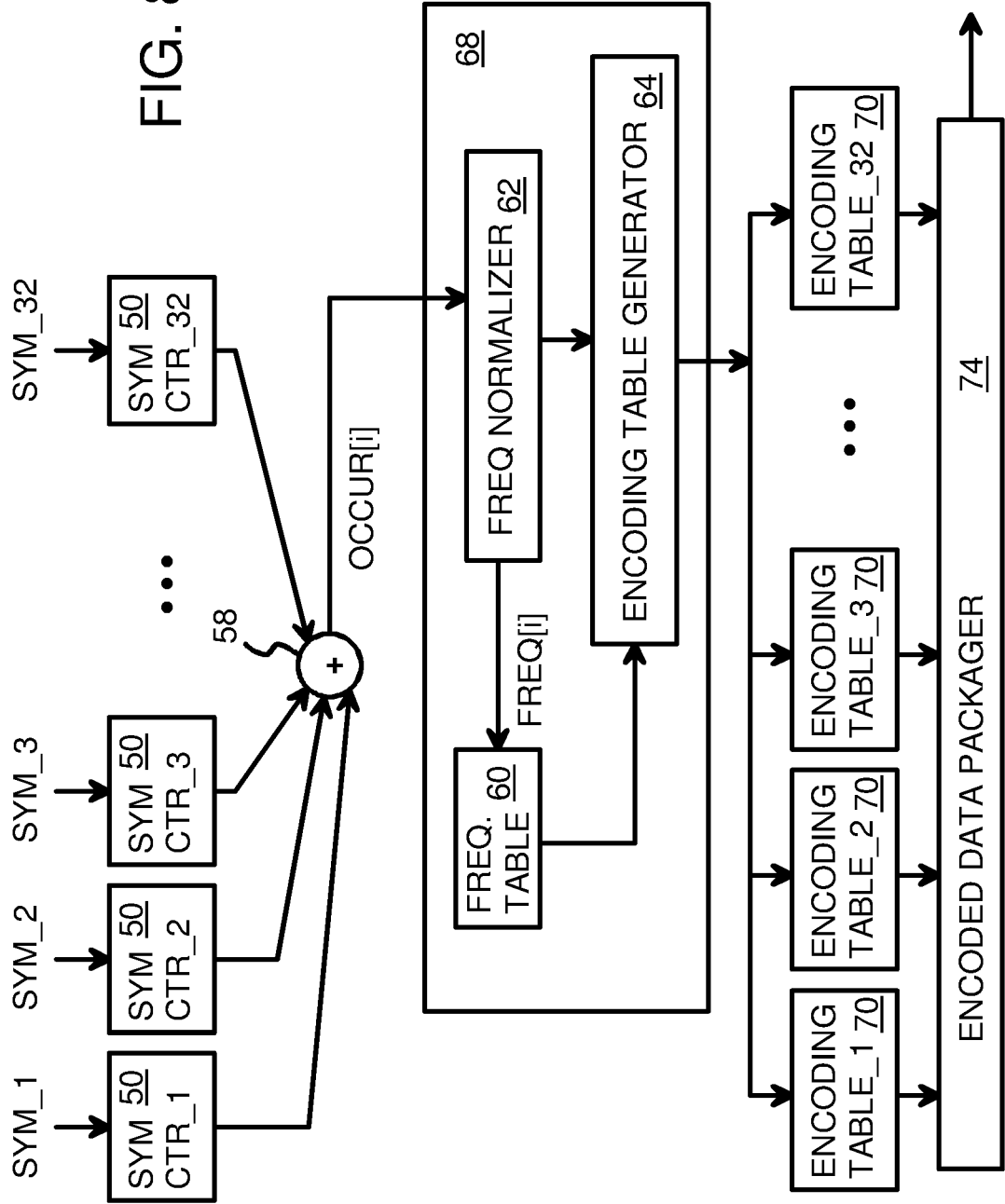
FIG. 8 shows parallel hardware to implement a normalizing data compressor.

FIG. 8 shows parallel hardware to implement a normalizing data compressor. Symbol counter 140 (FIG. 2) and occurrence memory 10 are implemented in parallel to reduce latency. For example, assuming that the input bus width of the compression/decompress module is 256-bits or 32-bytes, a 4K block of byte symbols can have 32 instances of symbol counter cell 50 in parallel. A total of 32 bytes can be processed per clock cycle using 32 symbol counter cells 50. A total of 128 clocks are needed to input all 4K bytes. Each symbol counter cell 50 has 256 memory locations or counters for the 256 possible symbol values. After the 4K block has been processed by symbol counter cells 50, the 32 counter values from the 32 instances of symbol counter cell 50 are summed by adder 58 to obtain the final occurrence value OCCUR[i] for each of the 256 symbol values. Adder 58 generates as many as 256 sums and outputs 256 OCCUR[i] values over an additional 256 clock cycles, or a total of 128+256=384 clock cycles.

During the 256 clock cycles that adder 58 is generating and outputting the 256 values of OCCUR[i], normalizer 62 is processing each OCCUR[i] value using the method of FIGS. 4-6 to generate a normalized FREQ[i] value for each OCCUR[i] value. The FREQ[i] values are stored in frequency table 60 and are corrected for any overruns by the sub-processes of FIGS. 5-6. Encoding table generator 64 reads each FREQ[i] value and generates one or more encoding table entries that are replicated and stored in 32 instances of encoding table 70.

Encoding table generator 64 does not have to wait until all 256 values of FREQ[i] have been generated by normalizer 62. Instead, as each FREQ[i] is generated by normalizer 62, encoding table generator 64 immediately generates the encoding table entries for this FREQ[i] value. Thus normalizer 62 and encoding table generator 64 can operate at the same time without waiting for frequency table 60 to be completed. Normalization and encoding entry generation can be performed as a combined step, greatly reducing latency.

Since normalization and encoding table generation can be performed at the same time, without encoding table generator 64 having to wait for frequency table 60 to be filled, normalizer 62, frequency table 60, and encoding table generator 64 can operate together as a single stage, such as normalizer-encoding generator stage 68. Latency can be reduced by using normalizer-encoding generator stage 68 rather than have encoding table generator 64 wait for normalizer 62 to finish generating normalized symbol frequencies for all 256 possible symbols.

Rather than have a single encoding table, the encoding table is replicated 32 times as encoding table 70. Each encoding table 70 can encode one input byte from the 4 k input block. Thus 32 bytes can be encoded at once for each clock cycle. A total of 128 clock cycles are needed to encode the entire 4K byte input block to generate the compressed data block. Encoded data packager 74 combines the 32 encodings per clock cycle over the 128 clocks to form the compressed data payload. Encoded data packager 74 also attaches a header that can include one copy of frequency table 60. The header and payload are output as the compressed block.

Figure 9:
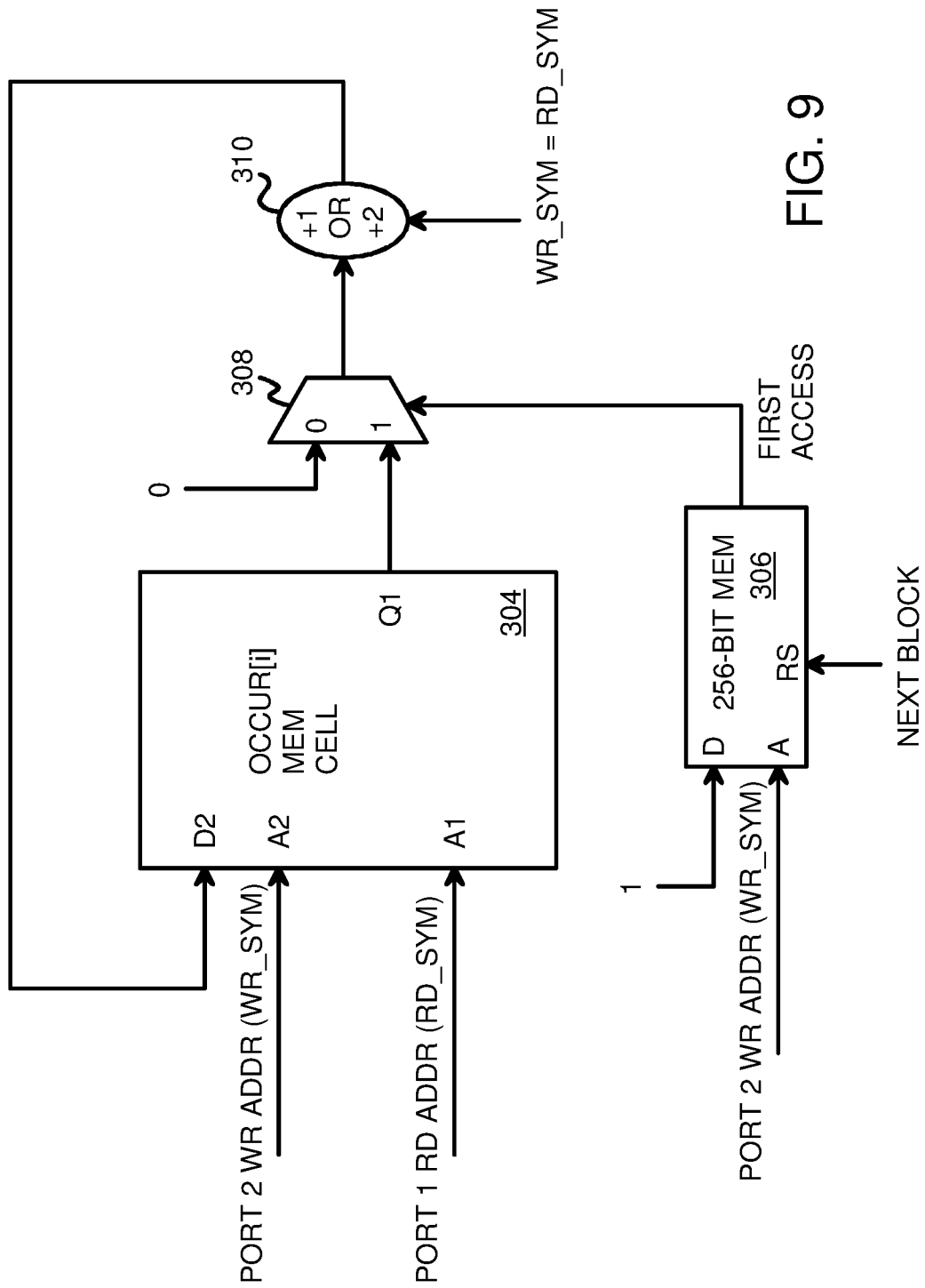
FIG. 9 shows the symbol counter cell in more detail.

FIG. 9 shows the symbol counter cell in more detail. Partial occurrence memory 304 has 256 memory locations for the 256 possible symbol values. Each memory location stores a partial counter that counts the occurrences of a symbol for the input bytes input to this symbol counter cell.

The input symbol value is used as the memory address. Each symbol from the input block is applied to partial occurrence memory 304 as the memory address A2 to be written for port 2.

Each time a memory location is written, the stored value in partial occurrence memory 304 is incremented. Thus partial occurrence memory 304 stores counter values and is addressed by symbol values.

Partial occurrence memory 304 is a dual-port memory that has a read port and a write port. Partial occurrence memory 304 is read and updated when symbol counting occurs, and is read and summed by adder 58 when normalizer 62 reads the OCCUR[i] values.

The write cycle is a read-modify-write operation. The symbol is applied to A1 as the read address, causing that symbol location in partial occurrence memory 304 to be read and output on Q1. When this is not the first access, mux 308 passes Q1 through to adder 310, which adds 1 to Q1 to increment the counter value. The incremented count from adder 310 is fed back to the D2 write-data input and written into the memory location applied to A2 as the write address for this symbol. Thus the old counter value is read from memory, incremented, and written back into memory.

Clearing all counters in partial occurrence memory 304 for each new input block would require special reset hardware or many clock cycles. Instead, each counter is cleared during the first access of that location for a new block. Memory 306 is a 256-bit memory with 256 locations of 1-bit memory. All bits in memory 306 are cleared when the next block begins processing. The symbol is applied as the address to memory 304, causing that location's bit to be read and applied to the control input of mux 308. For the first access of a new symbol after a new block, the bit read from memory 306 will be 0, causing mux 308 to drive a 0 to adder 310, which can then be incremented and stored back into partial occurrence memory 304. A1 is written back into memory 304 for that symbol location, so future accesses with that symbol will output a 1 to mux 308, causing it to pass through the counter value from partial occurrence memory 304.

Sometimes the same symbol can occur twice in the input stream to partial occurrence memory 304. These back-to-back writes may not allow sufficient time for partial occurrence memory 304 to be written. This back-to-back condition can be detected when the write address matches the read address, since partial occurrence memory 304 is written during symbol counting and immediately read in the next clock in some embodiments. When the read address for a current symbol matches the write address for a next symbol that immediately follows the current symbol in the input block, the same symbol occurred twice back-to-back. The counter should be incremented by 2 for these 2 back-to-back symbols. Adder 310 adds 2 rather than 1 when the read and write symbols (addresses) match. Then the second write can be cancelled.

Figure 10:
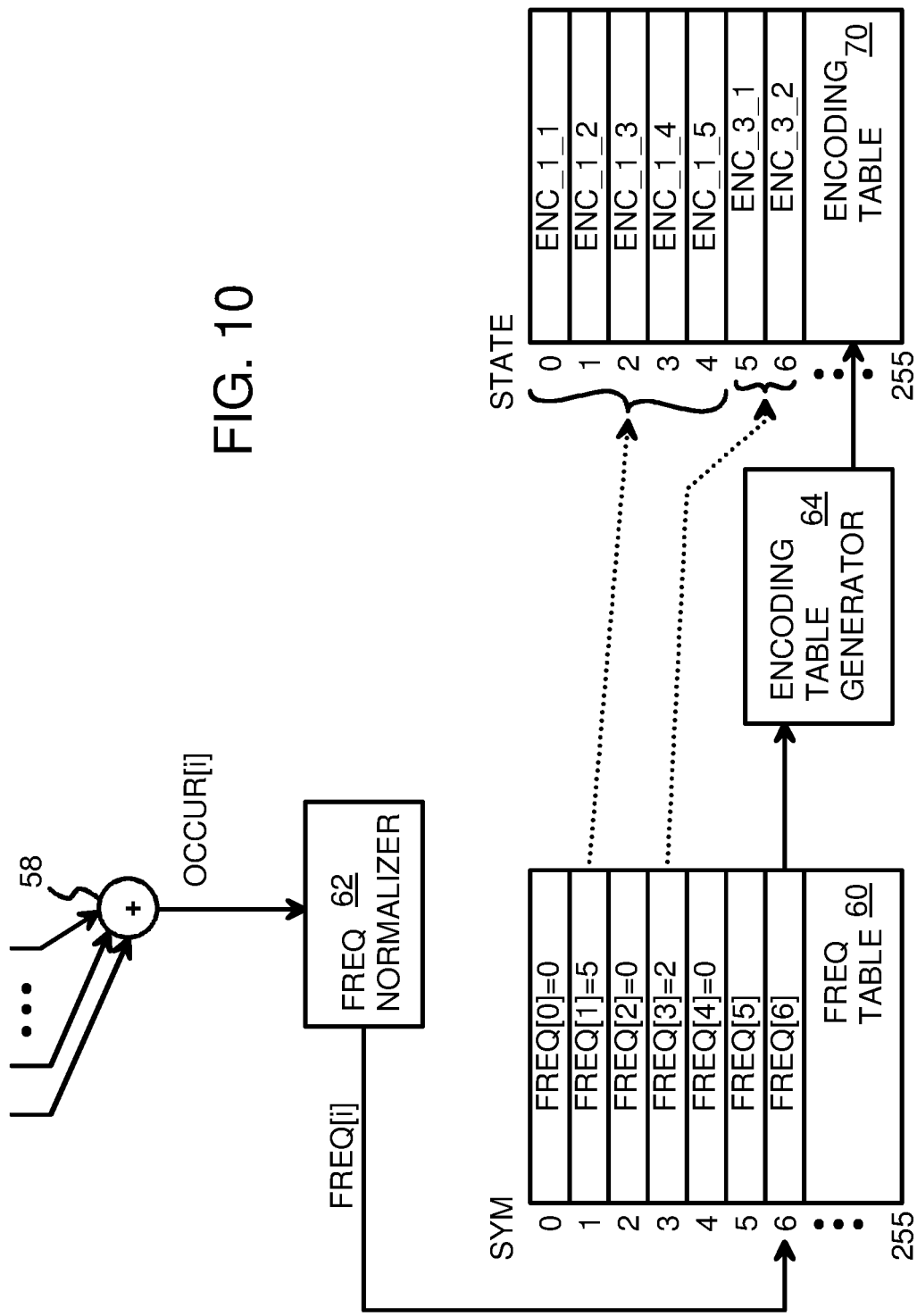
FIG. 10 highlights encoding table generation proceeding before normalization is completed.

FIG. 10 highlights encoding table generation proceeding before normalization is completed. Rather than wait for the frequency table to be filled and completed, encoding table generator 64 generates encoding entries as soon as a symbol frequency FREQ[i] becomes available from normalizer 62.

Adder 58 sums the partial occurrence counts from symbol counter cells 50 (FIG. 8) to generate OCCUR[i] for a current symbol i. Normalizer 62 performs the process of FIG. 4, also performing overrun checking (FIG. 5) and error compensation (FIG. 6) as needed when there are accumulated errors and a FREQ[i] value of 2 or more.

Since accumulated errors are compensated for as normalization occurs, eventual overruns near the end of the block are precluded. The symbol frequency values FREQ[i] will not need to be adjusted later for overrun compensation as in the prior art since error compensation is performed on-the-fly when generating the FREQ[i] values. Thus once normalizer 62 generates a FREQ[i] value, that FREQ[i] value will not later be adjusted due to an overrun.

The normalized symbol frequency value FREQ[i] can immediately be assigned one or more entries in the encoding table, since normalization and overrun processing limit the aggregate of the symbol frequency values to the number of states or slots in the encoding table. Symbol frequency values FREQ[i] are not dependent on un-processed symbols (>i). The encoding table will not prematurely run out of states or entries. The encoding table will not overrun.

Thus encoding table generator 64 can process the symbol frequencies FREQ[i] as they become available from normalizer 62.

Encoding table generator 64 obtains a FREQ[i] value generated by normalizer 62, either directly from encoding table generator 64 or by reading the FREQ[i] entry from frequency table 60. The value of FREQ[i] indicates the number of entries or states reserved in the encoding table that correspond to this symbol i.

For example symbol 1 has FREQ[1]=5 in an entry in frequency table 60. Encoding table generator 64 creates 5 entries in the encoding table when processing FREQ[1]=5. States 0 to 4 in encoding table 70 have encodings for symbol 1.

Symbol 3 has FREQ[3]=2, so encoding table generator 64 reserves 2 entries in encoding table 70 for symbol 3. These 2 entries, at states 5 and 6, have encodings for symbol 3.

High-frequency symbols have larger values of FREQ[i] and are thus allocated more states in encoding table 70. These encodings can use fewer bits than for low-frequency symbols, resulting in better compression ratios.

Figure 11:
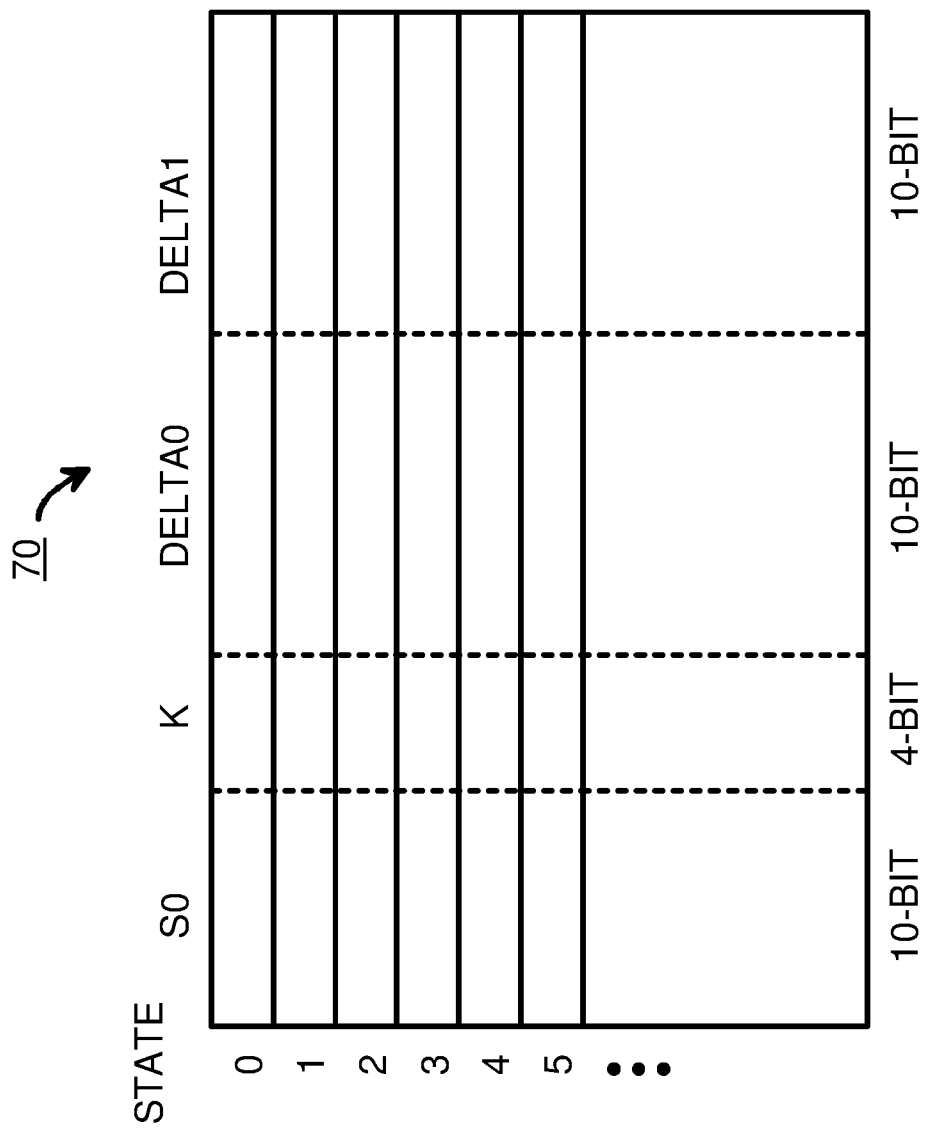
FIG. 11 shows entries in the encoding table.

FIG. 11 shows entries in the encoding table. Each entry corresponds to a state. Larger values of FREQ[i] require more states than smaller values of FREQ[i]. When FREQ[i] is 0, encoding table generator 64 skips the symbol and does not create an entry in the encoding table for this non-occurring symbol.

S0 is generated as FREQ[i]$\times 2^k$−256, where k is the number of leading zeros of FREQ[i]. This k is encoded as a 4-bit value and stored in the encoding table entry.

An offset is generated as offset[i]=CDF[i]=FREQ[0]+ FREQ[1]+FREQ[2]+ . . . FREQ[i−1]. Then Delta0 is generated as offset[i]−FREQ[i]+256/$2^k$, and Delta1 is generated as offset[i]−FREQ[i]+256/$2^{k-1}$. S0, Delta0, and Delta1 are 10-bit signed numbers.

Encoding table generator 64 writes S0, k, Delta0, and Delta1 to the entry in the encoding table. These values allow the encoder to replace an input symbol with encoded bits for the output data payload. Fewer encoding bits can be used for high-frequency symbols than for low-frequency symbols, likely resulting in a better compression ratio.

Figure 12:
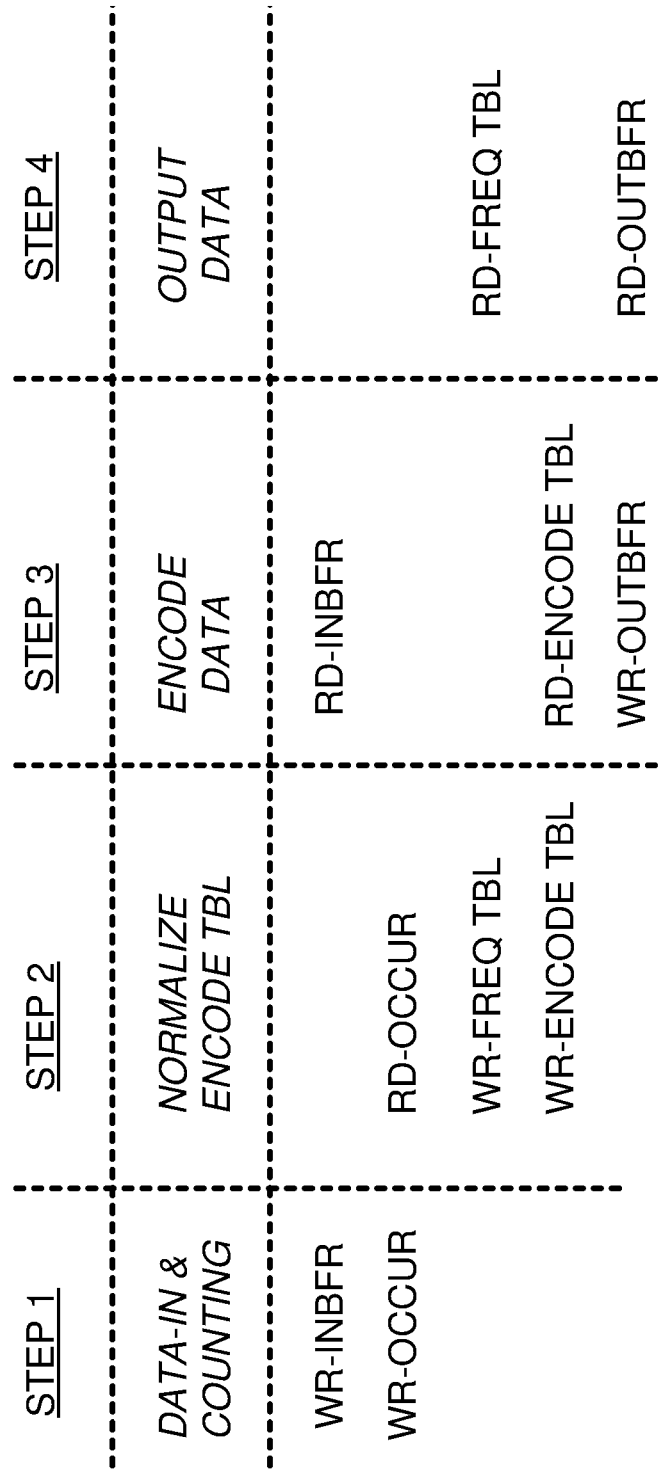
FIG. 12 shows a non-parallel flow of data encoding using the process and hardware of FIGS. 4-9.

FIG. 12 shows a non-parallel flow of data encoding using the process and hardware of FIGS. 4-9. The number of clock cycles required for processing a 4K block with 32 instances of symbol counter cell 50 and encoding table 70 is:

Step 1—Data Input and Symbol Counting: 128 clocks for symbol counter cells 50 to count all symbols in the input block. An input buffer is written with all 4K bytes of the input block, and the partial-sum OCCUR[i] values are written into symbol counter cells 50.

Step 2—normalization and encoding table generation: 256 clocks for adder 58, normalizer 62, and encoding table generator 64 to generate OCCUR[i], FREQ[i], and the encoding table entries for all 256 possible symbols i. The occurrences OCCUR[i] are read from symbol counter cells 50 while FREQ[i] is written to frequency table 60 and encoding entries are written to encoding table 70.

Step 3—data encoding: 128 clocks for encoding table 70 and encoded data packager 74 to encode all 4K input symbols. The input buffer is read to get the input symbols and encoding table 70 are read for the encodings to replace the input symbols. The encodings are written to an output buffer.

Step 4—output data: another 128 clocks may be needed to output all encodings in the compressed block. The output table is read for the encodings that form the compressed data payload and the frequency table is read and placed in the header.

Without pipelining, this is a total of 128+256+128+128=640 clocks to process each 4K byte block.

Figure 13:
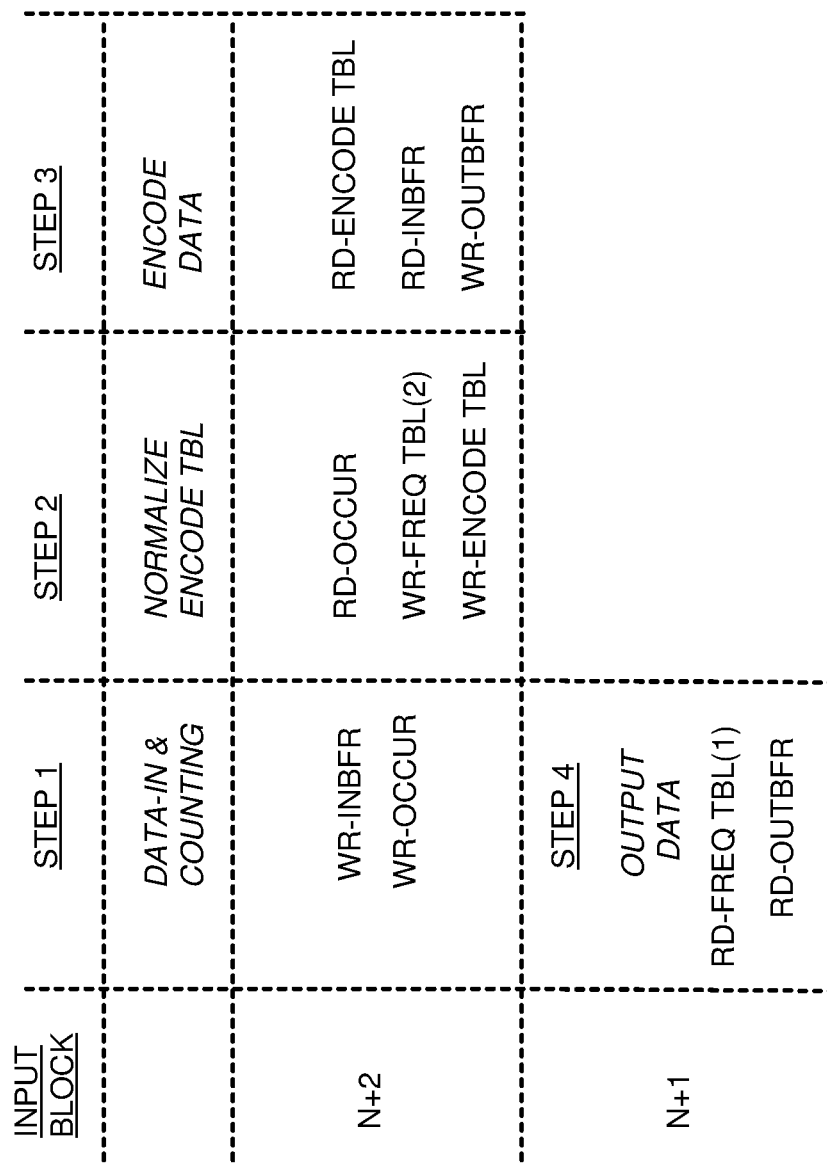
FIG. 13 shows a compressor flow with steps 1 and 4 operated in parallel.

FIG. 13 shows a compressor flow with steps 1 and 4 operated in parallel. The process and hardware of FIGS. 4-9 are used. In the embodiment steps 1 and 4 are operated in parallel, in a same time slot, so that they operate at the same time period during the same clock cycle, but on different input blocks of symbols. The input buffer is being written and symbol counter cells 50 are counting symbols for step 1 during the clock of combined steps 1 and 4 for a current input block, while the output buffer and the frequency table are being read to output data for step 4 for a previous input block.

The frequency table is duplicated. Freq table (1) is written in step 2 and is read in step 4. Since steps 1, 2, 3 are operating on next block 2, while step 4 is operating on prior block 1, step 4 reads the prior block's frequency table (1), while step 2 writes the next block's frequency table (2). RD-FREQ TBL (1) stores the data from the previous data block. WR-FREQ TBL (2) stores the data from the current data block.

The number of clock cycles required for processing a 4K block with 32 instances of symbol counter cell 50 and encoding table 70 is:

Steps 1 and 4—Data Input and Symbol Counting and Output data: 128 clocks for symbol counter cells 50 to count all symbols in the input block. The input buffer is written with all 4K bytes of the input block, and the partial-sum OCCUR[i] values are written into symbol counter cells 50. The output table is read for the encodings that form the compressed data payload and the frequency table is read and placed in the header.

Step 2—normalization and encoding table generation: 256 clocks for adder 58, normalizer 62, and encoding table generator 64 to generate OCCUR[i], FREQ[i], and the encoding table entries for all 256 possible symbols i. The occurrences OCCUR[i] are read from symbol counter cells 50 while FREQ[i] is written to frequency table 60 and encoding entries are written to encoding table 70.

Step 3—data encoding: 128 clocks for encoding table 70 and encoded data packager 74 to encode all 4K input symbols. The input buffer is read to get the input symbols and encoding table 70 are read for the encodings to replace the input symbols. The encodings are written to an output buffer.

With this step 1+4 operated in parallel, a total of 128+256+128=512 clocks are required. Steps 1, 2, and 3 operate on input block N+2, while step 4 operates on the prior input block N+1.

Figure 14:
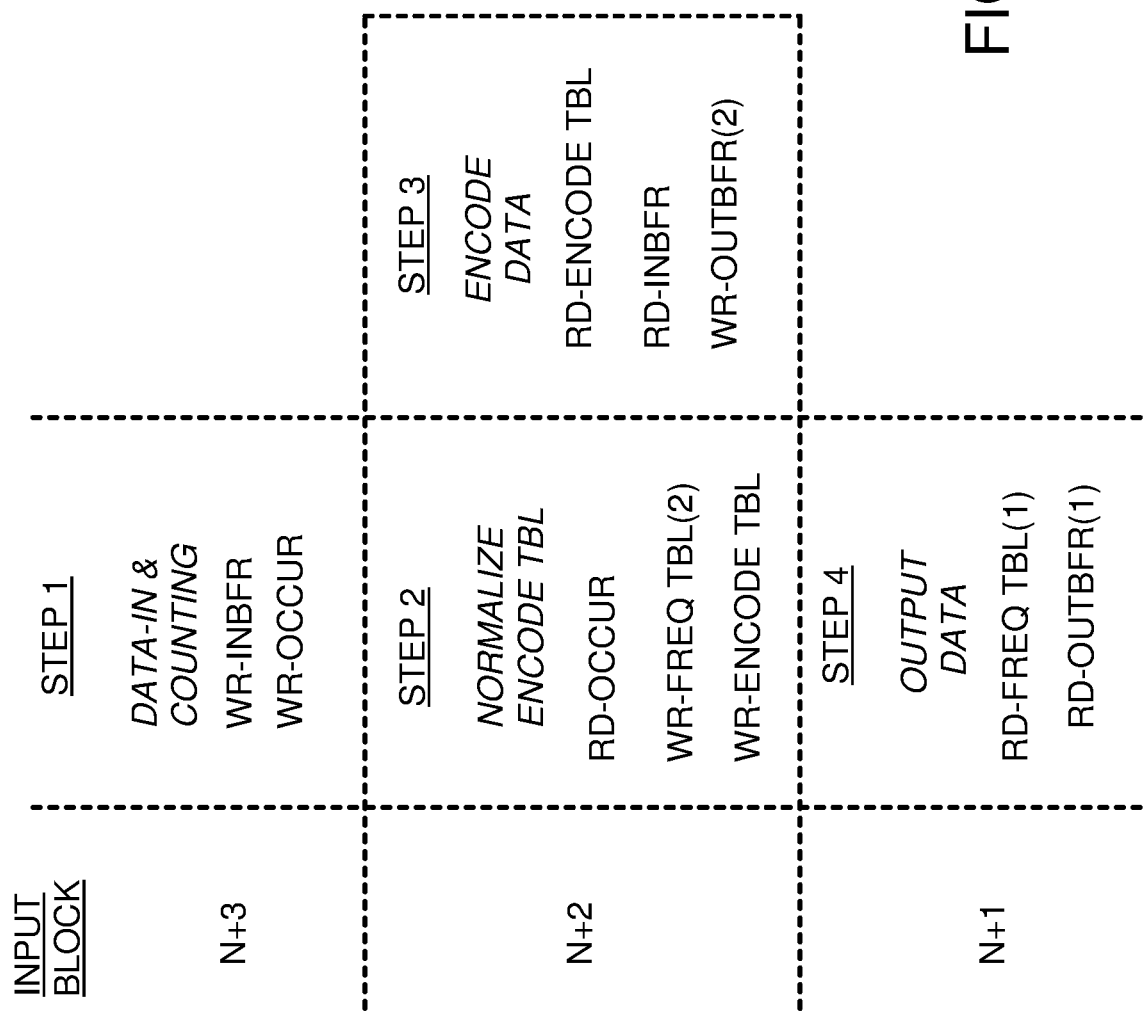
FIG. 14 shows a compressor flow with steps 1, 2, 4 operated in parallel.

FIG. 14 shows a compressor flow with steps 1, 2, 4 operated in parallel. The process and hardware of FIGS. 4-9 are used. In the embodiment steps 1 and 2 and 4 are operated in parallel so that they operate at the same time during the same clock cycle. Step 1 operates on input block N+3, steps 2, 3 operate on input block N+2, and step 4 operates on input block N+1.

During this pipe stage clock cycle, for step 1 the input buffer is being written and symbol counter cells 50 are counting symbols. For step 2 OCCUR[i] are read from symbol counter cells 50 and added by adder 58 allowing normalizer 62 to write FREQ[i] to frequency table 60. Also encoding table generator 64 writes encoding entries to encoding table 70.

The frequency table is duplicated. Freq table (2) is written in step 2 and is read in step 4. Since steps 2, 3 are operating on next block N+3, while step 4 is operating on prior block N+1, step 4 reads the prior block's frequency table (1), while step 2 writes the next block's frequency table (2).

The output buffer is also duplicated. Step 3 is writing encoded data for input block N+2, while step 4 is reading encoded data for input block N+1.

With this step 1+2+4 parallelization, a total of 256+128=384 clocks are required per input block.

Figure 15:
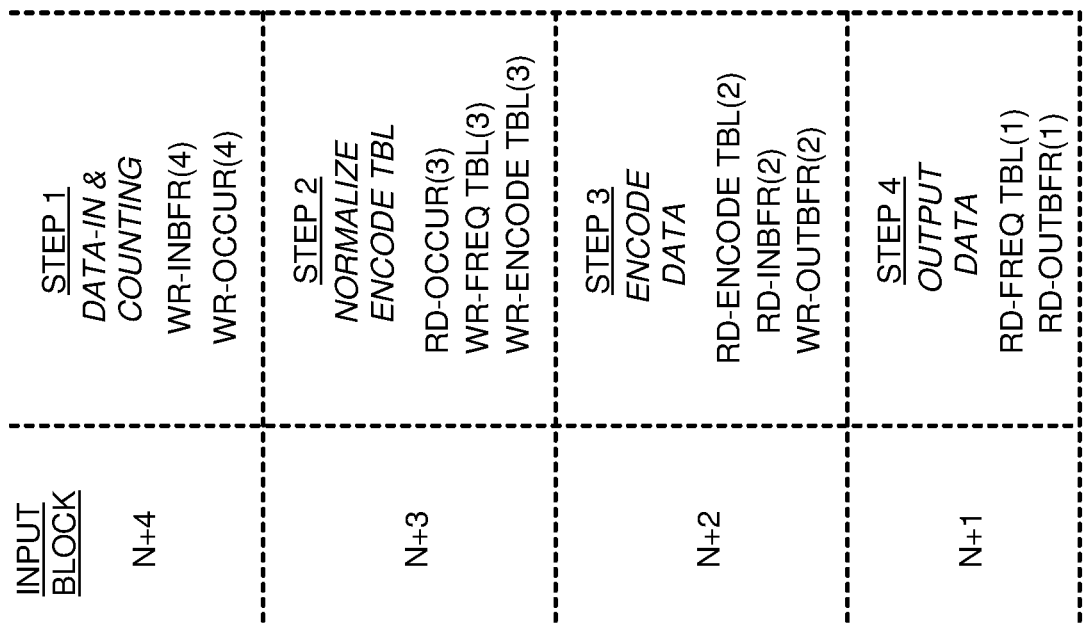
FIG. 15 shows a compressor flow with steps 1, 2, 3, 4 operated in parallel.

FIG. 15 shows a compressor flow with steps 1, 2, 3, 4 operated in parallel. The process and hardware of FIGS. 4-9 are used. In the embodiment steps 1 and 2 and 3 and 4 are operated in parallel so that they operate at the same time slot during the same clock cycle(s).

During this pipe stage clock cycle, for step 1 the input buffer is being written and symbol counter cells 50 are counting symbols. For step 2 OCCUR[i] are read from symbol counter cells 50 and added by adder 58 allowing normalizer 62 to write FREQ[i] to frequency table 60. Also encoding table generator 64 writes encoding entries to encoding table 70.

The input buffer, output buffer, frequency table, symbol counter cells 50, and encoding table 70 are duplicated so as to operate on two different blocks of data at the same time. With this step 1+2+4 operated in parallel, a total of 256 clocks are required per input block.

ALTERNATE EMBODIMENTS

Several other embodiments are contemplated by the inventors. For example a 4K byte input block with 8-bit symbols has been described as being normalized with a normalization ratio of 16 down to a frequency table that is sued to generate an encoding table having 256 states. Other values for these parameters may be selected, such as using 16-bit symbols, 4-bit symbols, or other fixed-length symbols, and different block sizes such as 16K bytes, different normalization ratios, etc. Zero-occurrence symbols at the beginning and at the end of the block may be skipped so that processing starts with the first non-zero-occurrence symbol and ends with the last non-zero-occurrence symbol.

Many data formats may be used for OCCUR[i], FREQ[i], or for other values, such as signed, unsigned, two's complement, binary, etc. Various transformation and encodings may be used or stored in the tables in different formats. For example, encoding table 70 may have entries that store the actual encoding bits that replace the input symbols to form the data payload, or these encoding entries may instruct other logic such as encoder 156 or encoded data packager 74 on how to encode the input symbols.

Figure 3A:
FIGS. 3A-3C highlight normalization of symbol occurrences to generate a frequency table.
Figure 3B:
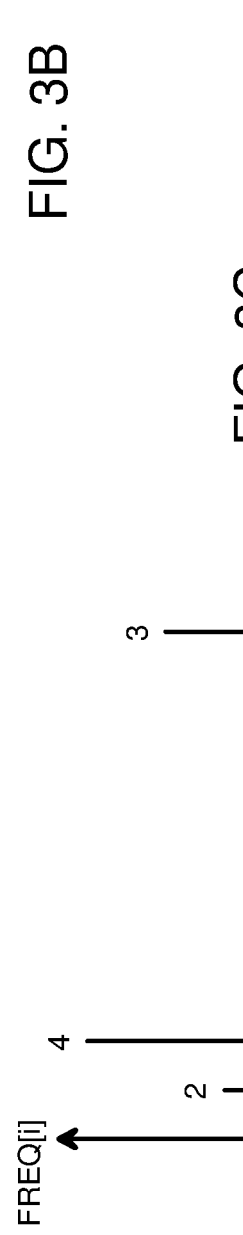
Figure 3C:
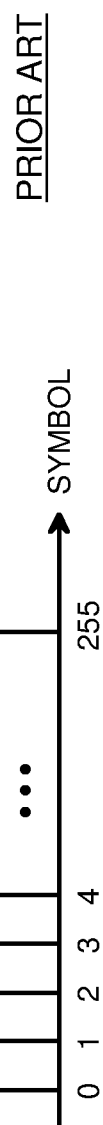

While a FLOOR operator has been described, a ceiling operator or other rounding operators could be substituted or modified such as for FT[i]. Modulo dividers could be used as the FLOOR operator, and may be modified in various ways. Various biases or other operations may be added for various conditions, such as to preserve small non-zero values by assigning FREQ[i]=1 to values between but not including zero and 1 (FIG. 3B).

The accumulated error can be an accumulation of remainders from module division of the symbol occurrence with the normalization ratio L as the divisor or modulo. The accumulated error and the remainders from rounding or modulo division can be defined to be either positive or negative. Incrementing rather than decrementing could be substituted and indexes may start from 0 or 1 and increase rather than decrease from an initial maximum value. Zero-occurrence symbols could be skipped as described or could be processed and have null or other entry values in tables.

The trigger or threshold for error compensation may be whenever the accumulated error is negative, or may have some other threshold, such as the accumulated error being more negative than a threshold such as −5.

Encoding table generator 64 may create a single copy of encoding table 70 and later replicate encoding table 70 to the 32 instances show in FIG. 8. Replicator logic may be added to copy entries from the first encoding table 70 generated by encoding table generator 64 to the 32 instances of encoding table 70 used during parallel encoding.

While 256 entries in frequency table 60 have been described for 8-bit symbols that have 256 possible values, not all possible symbol values may be present in any particular data input block. The non-present symbols do not need to have entries in frequency table 60 nor in encoding table 70. Thus it is understood that 256 is the maximum number of entries, and some blocks may have less than this maximum.

The number of unprocessed symbols remaining in the block, SYM_REM, may be set to the total number of non-zero-occurrence symbols to process, TSYM. As an alternative, TSYM can be set to the total number of symbols to process from the first non-zero-occurrence symbol to the last non-zero-occurrence symbol, which can include intervening zero-occurrence symbols. Alternately, TSYM can be the total number of all symbols, which is determined by the input block size. For example, input symbols that are 8-bit symbols (1 byte) have 256 possible symbols, or TSYM=256.

Pipelining may be arranged in a variety of ways and many alternatives are possible. Adder 58 could be placed in the first stage with the symbol counter to generate the final occurrence counts, or adder 58 could be placed in the second stage with occurrence memory 10 being partitioned when there are many symbol counter cells that each operate on a different slice of the input block. Encoding table generator 64 could operate a few symbols behind normalizer 62 yet still be in the same pipe stage. A faster output buffer might allow step 4 and step 3 to be merged into a same pipeline stage. Various additional buffers and logic could be added for better pipelining. Some memories may be shared, such as for occurrence memory 10 and encoding table 70, and some tables may be duplicated to allow for different pipe stages to operate on data from different input blocks.

Memory 306 can be implemented by a register, such as a D-type Flip Flop (DFF) with reset or a latch with reset. The DFF and Latch with reset can be reset in a single clock cycle.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include compressed data files, reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A data compression engine comprising:
an input for receiving an input block of symbols;
a symbol counter that counts occurrences of symbols in the input block;
a normalizer that normalizes symbol occurrence counts from the symbol counter to generate symbol frequencies;
wherein the normalizer generates an error for each symbol frequency generated from a symbol occurrence count;
an on-the-fly error tracker that accumulates and tracks the error created by the normalizer as the symbol occurrence counts are being processed by the normalizer; and
an on-the-fly overrun corrector that reduces a current symbol frequency for a current symbol and reduces the error tracked by the on-the-fly error tracker, wherein the current symbol is not a last symbol in the input block;

a frequency table for storing the symbol frequencies generated by the normalizer, whereby normalization errors are tracked and corrected on-the-fly before the last symbol in the input block has been normalized.

2. The data compression engine of claim 1 further comprising:

an encoding table that stores encoding entries;

an encoding table generator that assigns states and generates encoding entries in the encoding table in response to the symbol frequencies;

a data encoder that receives the input block of symbols and generates a data payload by replacing a symbol from the input block with an encoding from an encoding entry in the encoding table for the symbol; and an encoded data packager that attaches a copy of the encoding table to the data payload to form a compressed block.

3. The data compression engine of claim 2 wherein the encoding table generator has an overlapped timing with the normalizer, wherein the encoding table generator generates some of the encoding entries for the encoding table before the normalizer has finished generating all the symbol frequencies for the frequency table;

wherein the normalizer and the encoding table generator operate on a same input block at a same time;

wherein the encoding table generator is able to generate encoding entries for the encoding table before the normalizer has finished filling the frequency table since overrun is corrected on-the-fly by the on-the-fly overrun corrector;

wherein the error is a remainder from a rounding or modulo division operation performed by the normalizer.

4. The data compression engine of claim 3 wherein the normalizer further comprises:

a modulo divider that, for each symbol, divides a symbol occurrence count by a normalization ratio to generate an integer quotient that is assigned to a symbol frequency and a remainder that is assigned to the error;

whereby the on-the-fly error tracker accumulates and tracks remainders from the modulo divider.

5. The data compression engine of claim 2 wherein the on-the-fly overrun corrector is activated to reduce the current symbol frequency and reduce the error tracked by the on-the-fly error tracker when the current symbol frequency is at least 2 and the error tracked is reducible.

6. The data compression engine of claim 2 wherein the symbol counter further comprises:

a plurality of symbol counter cells operating in parallel to each other, each symbol counter cell counting symbol occurrences for a portion of the input block;

an adder that sums symbol occurrences from the plurality of symbol counter cells to generate the symbol occurrence counts applied to the normalizer;

whereby symbol counting is performed in parallel.

7. The data compression engine of claim 6 wherein the encoding table further comprises a plurality of local copies of the encoding table;

wherein the data encoder further comprises a plurality of data encoder cells operating in parallel, each data encoder cell encoding a portion of the input block, each data encoder cell reading encodings from a local copy of the encoding table in the plurality of local copies of the encoding table.

8. The data compression engine of claim 6 wherein the symbol counter cell further comprises:

an occurrence memory having N addressable locations, where N is a whole number of possible symbol values of the symbol in the input block of symbols;

an incrementor that increments a counter stored in a location in the occurrence memory that is addressed by a symbol value of a current input symbol being processed from the input block of symbols; and a reset mechanism for clearing the counter when a new input block is processed.

9. The data compression engine of claim 2 wherein the encoding table generator assigns a number of states for a symbol being processed, the number of states being equal to a value of the symbol frequency for the symbol being processed.

10. The data compression engine of claim 9 wherein the on-the-fly overrun corrector, when a number of states remaining in the encoding table is less than a number of unprocessed symbols in the input block plus the symbol frequency, reduces the symbol frequency to be equal to number of states remaining in the encoding table minus the number of unprocessed symbols in the input block, whereby overrun is prevented by the on-the-fly overrun corrector when the number of states remaining is insufficient.

11. The data compression engine of claim 2 wherein the frequency table further comprises:

an odd frequency table for storing symbol frequencies for an odd input block of symbols;

an even frequency table for storing symbol frequencies for an even input block of symbols;

wherein the input alternately receives the odd input block and the even input block;

wherein the normalizer alternately writes the odd frequency table when processing the odd input block and writes the even frequency table when processing the even input block;

wherein the encoded data packager alternately reads the odd frequency table when processing the odd input block and reads the even frequency table when processing the even input block;

wherein when the symbol counter is counting symbols for the odd input block while the encoded data packager is reading the even frequency table;

wherein the encoded data packager and the symbol counter operate simultaneously on different input blocks of symbols.

12. The data compression engine of claim 11 wherein the encoding table further comprises:

an odd encoding table for storing encoding entries for the odd input block of symbols;

an even encoding table for storing encoding entries for the even input block of symbols;

wherein the encoding table generator writes the odd encoding table when processing the odd input block and writes the even encoding table when processing the even input block;

wherein the encoded data packager operates on a first input block when the data encoder operates on a second input block and when the encoding table generator and the normalizer operate on a third input block and when the symbol counter operates on a fourth input block;

wherein the input receives the first input block, then the second input block, then the third input block, then the fourth input block in sequence;

whereby four input blocks are processed by four pipeline stages at a same time slot.

13. A symbol-frequency-normalizing data compressor comprising:
- an input unit that stores an input block of symbols into an input buffer, and that counts symbol occurrences in the input block;
- a normalizing encoder unit that comprises:
  - a rounder that divides symbol occurrence values from the input unit by a normalization ratio to generate symbol frequencies and remainders;
  - a frequency table that stores the symbol frequencies;
  - an error tracker that accumulates the remainders from the rounder to get an accumulated error that is tracked as symbols are processed;
  - an error compensator that reduces a current symbol frequency and reduces the accumulated error when the current symbol frequency is two or more and the accumulated error exceeds a trigger;
  - an encoding table generator that assigns a number of states for a current symbol that is equal to the current symbol frequency and that generates an encoding entry for the current symbol;
  - wherein the encoding table generator operates simultaneously with the rounder on a same input block, the encoding table generator processing a symbol from the same input block as the rounder that is within 10 symbols of separation from a symbol being processed by the rounder;
  - an encoding table that stores the encoding entries generated by the encoding table generator;
- an encoding unit that reads symbols from the input buffer, and for each symbol, reads an encoding entry in the encoding table and uses the encoding entry to write an encoding into a data payload in an output buffer; and
- an output unit having an encoded data packager that copies the frequency table to a header and attaches the header to the data payload read from the output buffer for output as a compressed data block.

14. The symbol-frequency-normalizing data compressor of claim 13 wherein the input unit and the output unit are operated simultaneously, wherein the frequency table is duplicated for storing symbol frequencies for two successive input blocks of symbols.

15. The symbol-frequency-normalizing data compressor of claim 14 wherein the input unit and the output unit and the normalizing encoder unit are operated simultaneously;
- wherein the output buffer is duplicated for storing data payloads for two successive input blocks of symbols.

16. The symbol-frequency-normalizing data compressor of claim 15 wherein the input unit and the output unit and the normalizing encoder unit and the encoding unit are operated simultaneously;
- wherein the encoding table is duplicated for storing encoding entries for two successive input blocks of symbols;
- wherein the input buffer is duplicated for storing the input block of symbols for two successive input blocks of symbols.

17. An on-the-fly error-compensating data compressor comprising:
- an input for receiving an input block of symbols;
- a symbol counter for counting symbol occurrences;
- a normalizer that divides the symbol occurrences from the symbol counter by a normalization ratio to generate temporary symbol frequencies and remainders, the normalizer for a current symbol generating a current temporary symbol frequency and a current remainder;
- an error tracker for accumulating final errors generated by the normalizer to generate an accumulated final error;
- an error corrector for reducing the current temporary symbol frequency to generate a reduced final symbol frequency when the current remainder plus the accumulated final error exceeds a threshold and the current temporary symbol frequency is at least 2;
- a frequency table that stores a current symbol frequency, the frequency table storing the reduced final symbol frequency as the current symbol frequency when the error corrector reduces the current temporary symbol frequency, the frequency table storing the current temporary symbol frequency current symbol frequency when the error corrector does not reduce the current temporary symbol frequency;
- an encoding table generator that generates a current encoding for the current symbol immediately after the current symbol frequency is written to the frequency table, the current encoding having a number of states equal to a value of the current symbol frequency, the encoding table generator writing the current encoding into an encoding table;
- a state tracker having a remaining states counter, the remaining states counter being initialized for a new block of symbols, the remaining states counter being reduced by the number of states for each current encoding generated by the encoding table generator;
- an overrun adjuster for reducing the current temporary symbol frequency to generate the reduced final symbol frequency when the remaining states counter has a count value that is less than a number of remaining symbols in the input block that have not yet been processed plus the current remainder and the current temporary symbol frequency is at least 2;
- an encoder that converts a current symbol in the input block to a current encoded symbol in response to the current encoding in the encoding table, the encoder converting all symbols in the input block to generate a data payload; and
- an encoded data packager that attaches a copy of the frequency table to the data payload to generate a compressed block for transmission instead of the input block,
- wherein the encoding table generator operates on the current symbol immediately after the current symbol frequency is generated and written to the frequency table,
- whereby latency is reduced by operating the encoding table generator in parallel with the normalizer and error corrector that prevent overrun errors.

18. The on-the-fly error-compensating data compressor of claim 17 wherein the normalizer divides the symbol occurrences using an operator selected from the group of a rounding operator, a FLOOR operator, a ceiling operator, or a modulo operator.

19. The on-the-fly error-compensating data compressor of claim 17 wherein the encoding table generator operates on the current symbol before the normalizer operates on a new current symbol that is separated from the current symbol by more than 2 symbols;
- whereby the encoding table generator and the normalizer simultaneously operate on current symbols in the input block that are within 2 symbols of each other.

20. The on-the-fly error-compensating data compressor of claim 17 wherein the error tracker generates the accumulated final error by adding a previous accumulated final error to a current symbol occurrence generated by the symbol counter for the current symbol and subtracting a product of the current symbol frequency and the normalization ratio.

\* \* \* \* \*